(12) United States Patent
Xiang (10) Patent No.: US 12,101,957 B2
(45) Date of Patent: Sep. 24, 2024

(54) DISPLAY PANEL AND MANUFACTURING METHOD THEREOF

(71) Applicant: TCL CHINA STAR OPTOELECTRONICS TECHNOLOGY CO., LTD., Shenzhen (CN)

(72) Inventor: Changming Xiang, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 856 days.

(21) Appl. No.: 15/734,416

(22) PCT Filed: Oct. 28, 2020

(86) PCT No.: PCT/CN2020/124379
§ 371 (c)(1),
(2) Date: Dec. 2, 2020

(87) PCT Pub. No.: WO2022/052235
PCT Pub. Date: Mar. 17, 2022

(65) Prior Publication Data
US 2022/0077422 A1    Mar. 10, 2022

(30) Foreign Application Priority Data
Sep. 9, 2020  (CN) .......................... 202010938578.7

(51) Int. Cl.
*H10K 50/844*    (2023.01)
*C09D 127/16*    (2006.01)
(Continued)

(52) U.S. Cl.
CPC ......... *H10K 50/844* (2023.02); *C09D 127/16* (2013.01); *C09D 129/04* (2013.01);
(Continued)

(58) Field of Classification Search
CPC ................. H10K 50/844; H10K 71/00; B32B 2307/762; C08J 7/065; C09D 129/04; C09D 177/06
See application file for complete search history.

(56) References Cited

U.S. PATENT DOCUMENTS

2015/0344697 A1    12/2015   Nam et al.
2015/0361332 A1    12/2015   Yam et al.
(Continued)

FOREIGN PATENT DOCUMENTS

CN    104884528 A    9/2015
CN    105408104 A    3/2016
(Continued)

*Primary Examiner* — Sophie Hon
(74) *Attorney, Agent, or Firm* — The Roy Gross Law Firm, LLC; Roy Gross (57) ABSTRACT

A display panel and a manufacturing method thereof are provided. The manufacturing method of the display panel include following blocks: providing a light-emitting element; coating a polymer solution on a light-emitting element and performing a first annealing process to the light-emitting element after it is coated with the polymer solution to form a first protecting layer; and coating an organic compound solution on the first protecting layer so that the organic compound solution is self-assembled on the first protecting layer to form a second protecting layer, wherein the second protecting layer has a crosslinking three-dimensional network structure.

17 Claims, 4 Drawing Sheets

(51) Int. Cl.
*C09D 129/04* (2006.01)
*C09D 133/12* (2006.01)
*C09D 167/02* (2006.01)
*C09D 177/06* (2006.01)
*C09D 179/08* (2006.01)
*C09D 181/02* (2006.01)
*H10K 71/00* (2023.01)
*H10K 85/60* (2023.01)

(52) U.S. Cl.
CPC ......... *C09D 133/12* (2013.01); *C09D 167/02* (2013.01); *C09D 177/06* (2013.01); *C09D 179/08* (2013.01); *C09D 181/02* (2013.01); *H10K 71/00* (2023.02); *H10K 85/60* (2023.02); *H10K 85/622* (2023.02); *H10K 85/625* (2023.02)

(56) References Cited

U.S. PATENT DOCUMENTS

2016/0088756 A1   3/2016   Ramadas
2017/0092897 A1*  3/2017   Liu ..................... H10K 50/846

FOREIGN PATENT DOCUMENTS

| | | | | |
|---|---|---|---|---|
| CN | 106409873 | A | | 2/2017 |
| CN | 108023030 | A | | 5/2018 |
| CN | 112086583 | B | * | 8/2021 ........... C09D 127/16 |
| KR | 101543260 | B1 | | 8/2015 |

* cited by examiner

DISPLAY PANEL AND MANUFACTURING METHOD THEREOF

CROSS REFERENCE TO RELATED APPLICATIONS

This application is a National Phase Entry of PCT/CN2020/124379 filed on Oct. 28, 2020 claiming priority to Chinese application 202010938578.7 filed Sep. 9, 2020. The contents of these applications are incorporated by reference in their entirety.

TECHNICAL FIELD

The present disclosure relates to the field of display technology, and in particular, to a display panel and a manufacturing method thereof.

BACKGROUND

In a current organic light-emitting diode (OLED) display panel, OLED elements are generally encapsulated by disposing an encapsulation cover on OLED elements. The current display panel comprises a substrate, display elements, an encapsulation substrate, and a sealant which are configured to encapsulate the display elements, and a hydrophobic dam located at an outermost side of an encapsulation area. However, the current encapsulation structure and display elements have poor contact, and it is easy for moisture to enter into the display panel, resulting in poor performance of the display panel and poor reliability.

Therefore, it is necessary to provide a new technical solution to solve the above-mentioned technical problem.

SUMMARY

Embodiments of the present disclosure provide a display panel and a manufacturing method thereof which are used to improve poor reliability of the display panel due to moisture entering the display panel.

An embodiment of the present disclosure provides a manufacturing method of a display panel, comprising following blocks: providing a light-emitting element; coating a polymer solution on the light-emitting element followed by subjecting the light-emitting element to a first annealing process to the light-emitting element to form a first protecting layer; and coating an organic compound solution on the first protecting layer, and making the organic compound solution self-assembled on the first protecting layer to form a second protecting layer, wherein the second protecting layer has a crosslinking three-dimensional network structure.

In a manufacturing method of a display panel provided in an embodiment of the present disclosure, the block of coating the organic compound solution on the first protecting layer and making the organic compound solution self-assembled on the first protecting layer to form the second protecting layer comprises dispersing an organic compound in a solvent and adjusting hydrogen ion concentration (pH) of the solvent to acidity to form the organic compound solution; coating the organic compound solution on the first protecting layer and making the organic compound solution self-assembled on a surface of the first protecting layer to form a one-dimensional structure; and subjecting the one-dimensional structure to a second annealing process at an annealing temperature ranging from 25 degrees Celsius to 70 degrees Celsius to form the second protecting layer.

In a manufacturing method of a display panel provided in an embodiment of the present disclosure, pH of the organic compound solution ranges from 3 to 7.

In a manufacturing method of a display panel provided in an embodiment of the present disclosure, the organic compound comprises an aromatic hydrocarbon derivative having a carboxylic acid amide group.

In a manufacturing method of a display panel provided in an embodiment of the present disclosure, the organic compound comprises at least one of compounds represented by following chemical structural formulas:

(1)

(2)

and (3)

wherein R represents an alkane group with a carbon number of 1 to 8, x represents a number of the carboxylic acid amide group, and y represents a number of the carboxylic acid amide group, wherein $1 \leq x \leq 3$, $1 \leq y \leq 2$, and $1 \leq z \leq 2$.

In a manufacturing method of a display panel provided in an embodiment of the present disclosure, when x=2, the two carboxylic acid amide groups in the formula (1) are meta-substituted or para-substituted; when y=2, the two carboxylic acid amide groups in the formula (2) are meta-substituted or para-substituted; and when z=2, the two carboxylic acid amide groups in the formula (3) are meta-substituted.

In a manufacturing method of a display panel provided in an embodiment of the present disclosure, the organic compound comprises:

In a manufacturing method of a display panel provided in an embodiment of the present disclosure, after the block of coating the organic compound solution on the first protecting layer and making the organic compound solution self-assembled on the first protecting layer to form the second protecting layer, the method further comprises forming an encapsulation layer on the second protecting layer, wherein the encapsulation layer comprises at least one inorganic layer and at least one organic layer which are alternatively stacked.

In a manufacturing method of a display panel provided in an embodiment of the present disclosure, the first protecting layer is formed through anionic polymerization.

An embodiment of the present disclosure provides a display panel comprising: a light-emitting element; a first protecting layer covering at least a part of the light-emitting element, wherein materials of the first protecting layer comprise polymer materials; and a second protecting layer covering the first protecting layer, wherein the second protecting layer has a crosslinking three-dimensional network structure formed through self-assembly.

In a display panel provided in an embodiment of the present disclosure, materials of the second protecting layer comprise an aromatic hydrocarbon derivative having a carboxylic acid amide group.

In a display panel provided in an embodiment of the present disclosure, the aromatic hydrocarbon derivative having the carboxylic acid amide group comprises at least one of compounds in following chemical structural formulas:

(1)

and wherein R represents an alkane group with a carbon number of 1 to 8, x represents a number of the carboxylic acid amide group, and y represents a number of the carboxylic acid amide group, wherein $1 \leq x \leq 3$, $1 \leq y \leq 2$, and $1 \leq z \leq 2$.

In a display panel provided in an embodiment of the present disclosure, when x=2, the two carboxylic acid amide groups in the formula (1) are meta-substituted or para-substituted.

In a display panel provided in an embodiment of the present disclosure, when y=2, the two carboxylic acid amide groups in the formula (2) are meta-substituted or para-substituted.

In a display panel provided in an embodiment of the present disclosure, when z=2, the two carboxylic acid amide groups in the formula (3) are meta-substituted.

In a display panel provided in an embodiment of the present disclosure, the aromatic hydrocarbon derivative having a carboxylic acid amide group comprises:

In a display panel provided in an embodiment of the present disclosure, the display panel further comprises an encapsulation layer covering the second protecting layer, wherein the encapsulation layer comprises at least one inorganic layer and at least one organic layer which are alternatively stacked.

In a display panel provided in an embodiment of the present disclosure, materials of the first protecting layer comprise at least one of polyvinylidene fluoride, polyphenylene sulfide, ethylene vinyl alcohol copolymer, polyphthalamide, polyamide-imide, polyamide, polyetherimide, polymethyl methacrylate, and polyethylene terephthalate.

An embodiment of the present disclosure provides a display panel comprising: a light-emitting element; a first protecting layer covering at least a part of the light-emitting element, wherein materials of the first protecting layer comprise polymer materials, and the polymer materials comprise at least one of polyvinylidene fluoride, polyphenylene sulfide, ethylene vinyl alcohol copolymer, polyphthalamide, polyamide-imide, polyamide, polyetherimide, polymethyl methacrylate, and polyethylene terephthalate; and a second protecting layer covering the first protecting layer, wherein the second protecting layer has a crosslinking three-dimensional network structure, materials of the second protecting layer are formed by an aromatic hydrocarbon derivative having a carboxylic acid amide group through self-assembly, and the aromatic hydrocarbon derivative having the carboxylic acid amide group comprises at least one of compounds represented by following chemical structural formulas:

(1)

(2)

and (3)

wherein R represents an alkane group with a carbon number of 1 to 8, x represents a number of the carboxylic acid amide group, and y represents a number of the carboxylic acid amide group, wherein $1 \leq x \leq 3$, $1 \leq y \leq 2$, and $1 \leq z \leq 2$.

The embodiments of the present disclosure provide the display panel and the manufacturing method thereof. In the manufacturing method of the display panel provided in the embodiments of the present disclosure, the first protecting layer and the second protecting layer are formed on the light-emitting element in sequence. Due to the second protecting layer formed by an organic compound with small molecules through self-assembly and randomness of the small molecules during a growth process, the second layer has good hydrophobicity. During an assembly process of supermolecules by the organic compound with small molecules through self-assembly, because of the supramolecular assembly structure with a self-healing capability, it has good resistance to mechanical damage. Furthermore, because the second protecting layer has a polymer-like structure, it has high mechanical strength and good heat resistance. The first protecting layer has good light transmittance, and if the light-emitting element is physically damaged, damage of moisture to the light-emitting element can be reduced by consuming a side base of the first protecting layer. Therefore, the display panel and the manufacturing method thereof provided in the embodiments of the present disclosure are used to improve poor reliability of the display panel due to moisture entering the display panel.

DETAILED DESCRIPTION OF PREFERRED EMBODIMENTS

To make the purposes, technical solutions, and effects of the present disclosure clearer and more specific, the present disclosure is described in further detail below with reference to the accompanying drawings. Please refer to the schemas of the accompanying drawings, the identical elements are indicated by a same number. The below descriptions are based on the illustrated specific embodiments of the present disclosure, and shall not be deemed to limit other specific embodiments of the present disclosure not described herein. The term "embodiment" used in the description means an example, instance, or illustration.

In description of the disclosure, it should be understood that orientational or positional relationships represented by directional terms mentioned in the present disclosure, such as central, longitudinal, lateral, length, width, thickness, up, down, front, rear, left, right, vertical, horizontal, top, bottom, inside, outside, clockwise, anticlockwise, etc., are orientational or positional relationships based on the drawings, and are merely for the convenience of describing the present disclosure and simplifying the description, rather than indicating or implying that the device or element is intended to have a particular orientation, or is constructed and operated in a particular orientation, and therefore, should not be interpreted as a limitation of the present disclosure. In addition, terms such as "first" and "second" are used herein for purposes of description, and should not be interpreted as indication or implication of relative importance, or implied indication of a number of the technical features. Therefore, features limited by terms such as "first" and "second" can explicitly or impliedly include one or more than one of these features. In description of the disclosure, "a plurality of" means two or more than two, unless otherwise specified.

In description of the present disclosure, it should be understood that, unless specified or limited otherwise, the terms "mounted," "connected," "coupled," "fixed" and the like are used broadly, and may be, for example, fixed connections, detachable connections, or integral connections; may also be mechanical or electrical connections; may also be direct connections or indirect connections via intervening structures; may also be inner communications of two elements, which can be understood by those skilled in the art according to specific situations.

Figure 1:
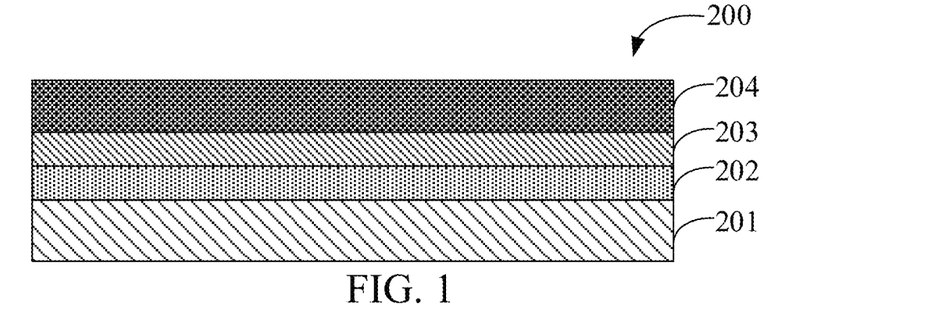
FIG. 1 is a structural schematic diagram illustrating a display panel provided in an embodiment of the present disclosure.
Figure 2:
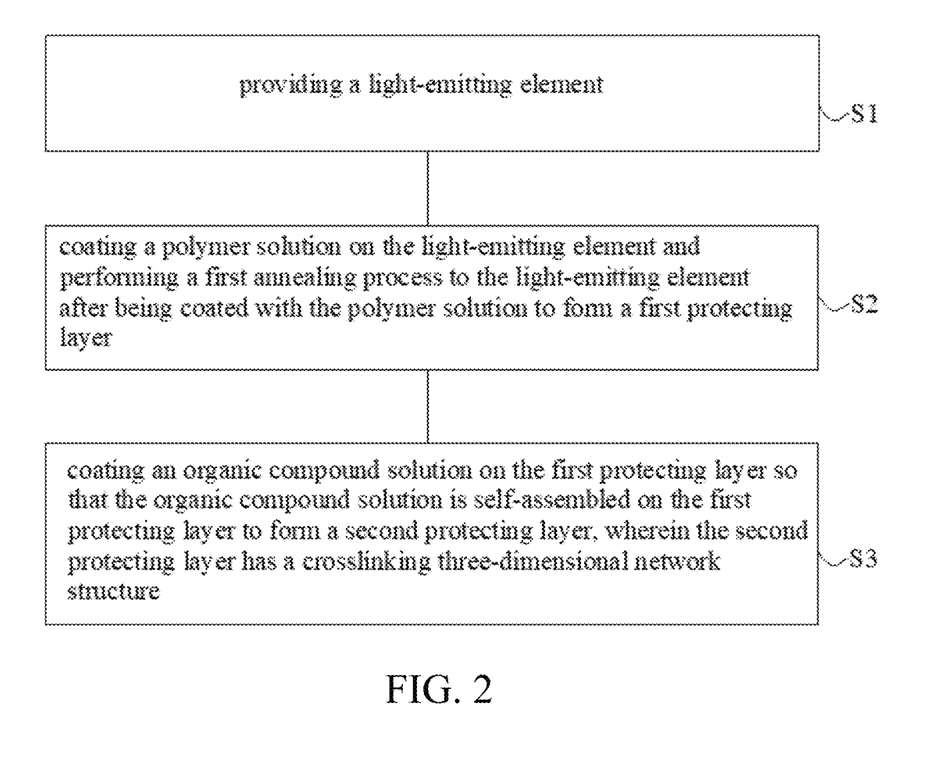
FIG. 2 is a flowchart illustrating a manufacturing method of a display panel provided in an embodiment of the present disclosure.

In combination with FIG. 1 and FIG. 2, an embodiment of the present disclosure provides a manufacturing method of a display panel, which comprises the following blocks:

A block S1 of providing a light-emitting element 201.

Wherein, the light-emitting element 201 comprises a substrate (not shown in the drawings), a driving circuit layer (not shown in the drawings) disposed on the substrate, and a light-emitting functional layer (not shown in the drawings) electrically connected to the driving circuit layer.

The light-emitting functional layer can comprise an anode electrode, a light-emitting layer, a cathode electrode, a hole injection layer, a hole transport layer, an electron transport layer, and an electron injection layer. The present disclosure does not limit a structure or a type of the light-emitting element 201.

A block S2 is coating a polymer solution on the light-emitting element 201 followed by subjecting the light-emitting element to a first annealing process to form a first protecting layer.

Specifically, the polymer solution is coated on the light-emitting element 201 by spin coating, drip coating, or doctor coating, and then the light-emitting element after being coated with the polymer solution is subjected to a first annealing process to form a first protecting layer 202. Wherein, an annealing temperature ranges from 30 degrees Celsius to 120 degrees Celsius. The first protecting layer 202 is attached to a first surface of the light-emitting element 201. Wherein, a molecular weight of the first protecting layer 202 ranges from 20,000 g/mol to 50,000 g/mol, and a polymer dispersion index (PDI) of the first protecting layer 202 equals or is less than 1.06. Materials of the first protecting layer 202 comprise polymer materials such as polyvinylidene fluoride, polyphenylene sulfide, ethylene vinyl alcohol copolymer, polyphthalamide, polyamide-imide, polyamide, polyetherimide, polymethyl methacrylate, and polyethylene terephthalate. Optionally, the first protecting layer 202 is formed through anionic polymerization in an embodiment.

A block S3 is coating an organic compound solution on the first protecting layer 202 and making the organic compound solution self-assemble on the first protecting layer 202 to form a second protecting layer 203, wherein the second protecting layer 203 has a crosslinking three-dimensional network structure.

Figure 3:
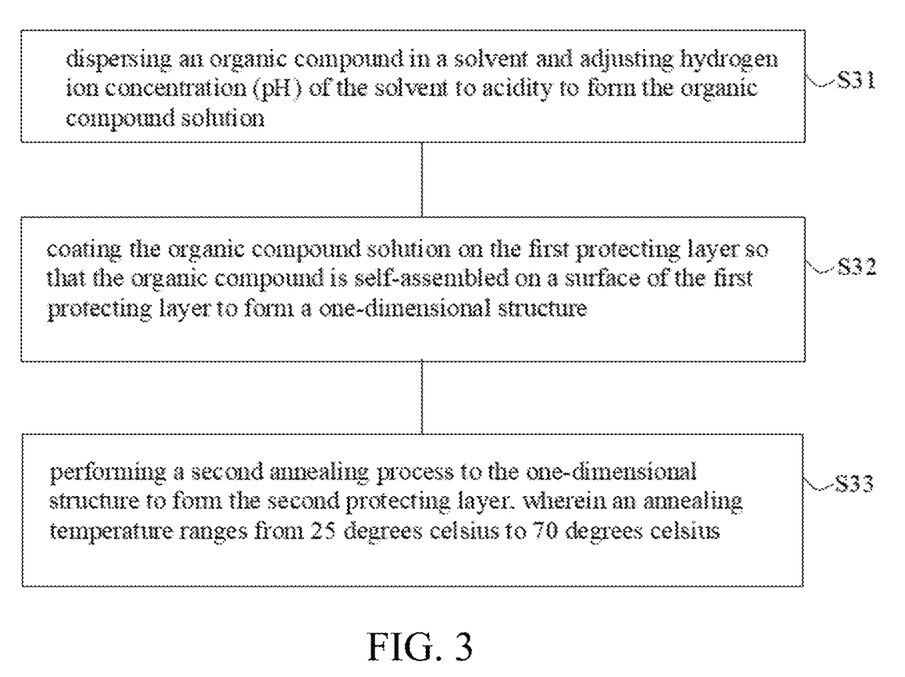
FIG. 3 is a flowchart illustrating block S3 in FIG. 2.

Referring to FIG. 3, specifically, the block S3 comprises:
a block S31 of dispersing an organic compound in a solvent and adjusting hydrogen ion concentration (pH) of the solvent to acidity to form the organic compound solution.

Wherein, the organic compound comprises an aromatic hydrocarbon derivative having a carboxylic acid amide group, and the aromatic hydrocarbon comprises at least one of a monocyclic aromatic hydrocarbon consisting of a benzene ring and a polycyclic aromatic hydrocarbon consisting of a triphenylene and a hexabenzocoronene. Specifically, the organic compound comprises at least one of compounds indicated by following chemical structural formulas:

(1)

-continued (2)

and (3)

wherein R represents an alkane group with a carbon number of 1 to 8, x represents a number of the carboxylic acid amide group, y represents a number of the carboxylic acid amide group, and wherein 1≤x≤3, 1≤y≤2, and 1≤z≤2. For example, R is one of methyl, ethyl, propyl, butyl, pentyl, hexyl, heptyl, and octyl groups, and kinds of R in the carboxylic acid amide groups of the aromatic hydrocarbons may be same or different. Wherein x comprises 1, 2, and 3, y comprises 1 and 2, and z comprises 1 and 2. When x=2, the two carboxylic acid amide groups in the formula (1) are meta-substituted or para-substituted, when y=2, the two carboxylic acid amide groups in the formula (2) are meta-substituted or para-substituted, and when z=2, the two carboxylic acid amide groups in the formula (3) are meta-substituted.

The solvent comprises N-methyl pyrrolidone and dimethyl acetamide, and hydrogen ion concentration (pH) of the organic compound solution ranges from 3 to 7. Preferably, the pH of the organic compound solution ranges from 5 to 6, and The mass concentration of the organic compound solution ranges from 1% to 20%.

A block S32 is coating the organic compound solution on the first protecting layer 202 and making the organic compound self-assembled on a surface of the first protecting layer 202 to form a one-dimensional structure.

Specifically, the organic compound solution is coated on the first protecting layer 202 by spin coating, drip coating, or doctor coating, and a one-dimensional structure is formed by hydrogen ions in the compound solution inducing molecular nucleation and chain growth.

A block S33 is subjecting the one-dimensional structure to a second annealing process at an annealing temperature ranging from 25 degrees Celsius to 70 degrees Celsius to form the second protecting layer 203, wherein the second protecting layer 203 comprises the crosslinking three-dimensional network structure. In an embodiment, the second protecting layer 203 comprises the highly crosslinking three-dimensional network structure.

In the embodiment of the present disclosure, a thickness of the second protecting layer can be controlled by a coating time of the organic compound solution and concentration of the organic compound solution.

Optionally, after the block S3, a block S4 is further included:

forming an encapsulation layer 204 on the second protecting layer 203, wherein the encapsulation layer 204 comprises at least one inorganic layer and at least one organic layer which are alternatively stacked. The inorganic layer can be selected from inorganic materials such as aluminum oxide, silicon oxide, silicon nitride, silicon oxynitride, silicon carbide, titanium oxide, zirconia, and zinc oxide. The organic layer can be selected from organic materials such as epoxy resin, polyimide (PI), polyethylene terephthalate (PET), polycarbonate (PC), polyethylene (PE), and polyacrylate. For example, the encapsulation layer 204 is a laminated structure of an aluminum oxide film, a polypropylene film, and a silicon nitride film, which are sequentially laminated. It should be noted that in the embodiment of the present disclosure, the first protecting layer 202 and the second protecting layer 203 can be used separately as a thin film encapsulation structure of the light-emitting element 201 or in conjunction with the encapsulation layer 204.

Please continue to refer to FIG. 1. An embodiment of the present disclosure provides a display panel 200. The display panel 200 can be an active light-emitting display panel, such as an organic light-emitting diode (OLED) display panel, an active-matrix organic light-emitting diode (AMOLED) display panel, a passive matrix OLED display panel, or a quantum dot light-emitting diode (QLED) display panel.

The display panel 200 comprises a light-emitting element 201, a first protecting layer 202, and a second protecting layer 203, wherein the light-emitting element 201 comprises a substrate (not shown in the drawings), a driving circuit layer (not shown in the drawings) disposed on the substrate, and a light-emitting functional layer (not shown in the drawings) electrically connected to the driving circuit layer.

The light-emitting element 201 comprises an organic light-emitting diode element, and the light-emitting functional layer can comprise an anode electrode, a light-emitting layer, a cathode electrode, a hole injection layer, a hole transport layer, an electron transport layer, and an electron injection layer. The present disclosure does not limit a structure or a type of the light-emitting element 201.

The first protecting layer 202 covers at least part of the light-emitting element 201, wherein materials of the first protecting layer 202 comprises polymer materials. In this embodiment of the present disclosure, the first protecting layer 202 either only covers the light-emitting functional layer or a whole substrate. Molecular weight of the first protecting layer 202 ranges from 20,000 g/mol to 50,000 g/mol, and a polymer dispersion index (PDI) of the first protecting layer 202 equals or is less than 1.06. Materials of the first protecting layer 202 comprise polymer materials such as polyvinylidene fluoride, polyphenylene sulfide, ethylene vinyl alcohol copolymer, polyphthalamide, polyamide-imide, polyamide, polyetherimide, polymethyl methacrylate, and polyethylene terephthalate. The first protecting layer 202 provided in the embodiment of the present disclosure has good light transmittance and good adhesion to the light-emitting element 201, thus protecting the light-emitting element 201 from erosion of moisture.

The second protecting layer 203 covers the first protecting layer 202, is formed by a self-assembled organic compound, and has a crosslinking three-dimensional network structure. Wherein, the second protecting layer 203 has a self-healing capability, and materials of the second protecting layer 203 comprise an aromatic hydrocarbon derivative having a carboxylic acid amide group.

Wherein, the aromatic hydrocarbon comprises at least one of a monocyclic aromatic hydrocarbon consisting of a benzene ring or a polycyclic aromatic hydrocarbon consisting of a triphenylene and a hexabenzocoronene.

Specifically, the aromatic hydrocarbon derivative having the carboxylic acid amide group comprises at least one of compounds in following chemical structural formulas:

(1)

(2)

and (3)

wherein R represents an alkane group with a carbon number of 1 to 8, x represents a number of the carboxylic acid amide group, and y represents a number of the carboxylic acid amide group, wherein $1 \leq x \leq 3$, $1 \leq y \leq 2$, and $1 \leq z \leq 2$.

Specifically, the aromatic hydrocarbon derivative having the carboxylic acid amide group comprises:

In this embodiment, the first protecting layer 202 and the second protecting layer 203 can be used separately as a thin film encapsulation structure of the light-emitting element 201 or in conjunction with the encapsulation layer 204. Referring to FIG. 1, in an embodiment, the display panel comprises the encapsulation layer 204, and the encapsulation layer 204 comprises at least one inorganic layer and at least one organic layer which are alternatively stacked. The inorganic layer can be selected from inorganic materials such as aluminum oxide, silicon oxide, silicon nitride, silicon oxynitride, silicon carbide, titanium oxide, zirconia, and zinc oxide. The organic layer can be selected from organic materials such as epoxy resin, polyimide (PI), polyethylene terephthalate (PET), polycarbonate (PC), polyethylene (PE), and polyacrylate. For example, the encapsulation layer 204 is a laminated structure of an aluminum oxide film, a polypropylene film, and a silicon nitride film, which are sequentially laminated.

In the display panel provided in this embodiment of the present disclosure, the polymer is used as the first protecting layer of the light-emitting element, and the second protecting layer with a cross-linking three-dimensional network structure is formed through self-assembly of the organic compound. Due to randomness of small molecules during a growth process, the second layer has good hydrophobicity. Furthermore, as a self-assembly process of the organic compound is a supramolecular assembly process, the second layer is resistant to mechanical damage due to self-healing capabilities of supramolecular assemblies. Furthermore, because the second protecting layer has a polymer-like structure, it has high mechanical strength and good heat resistance. The first protecting layer has good light transmittance, and if the light-emitting element is physically damaged, damage of moisture to the light-emitting device can be reduced by consuming a side base of the first protecting layer. In addition, the encapsulation layer is disposed on the second protecting layer in this embodiment of the present disclosure to further prevent moisture from eroding the light-emitting element.

The display panel and manufacturing method thereof provided in this disclosure are explained with reference to specific embodiments as below. First, benzene (1,3,5 trivaleric acid acetamido group) with a mass of 1.0 gram, namely compound 1 (whose molecular structure is shown in formula 1), is dissolved in N-methyl pyrrolidone to prepare an organic compound solution whose mass concentration ranges from 1% to 20%, and pH of the organic compound solution is adjusted using hydrochloric acid, to bring the pH of the compound 1 solution to between 3 and 7. Then, the compound 1 solution is coated on a surface of the first protecting layer 202. Since nitrogen and oxygen atoms in compound 1 have lone pair electrons, unbonded electron pairs in the nitrogen and oxygen atoms interact with each other and induce molecular nucleation and chain growth to form a one-dimensional structure in an acidic condition. Next, a highly cross-linking three-dimensional network structure is formed to obtain the second protecting layer 203 through a second annealing process.

Figure 4:
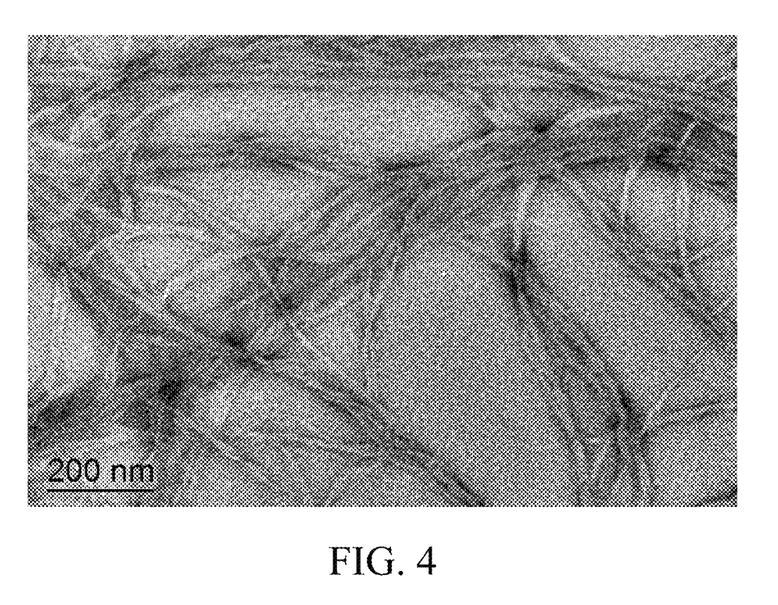
FIG. 4 is a characterization diagram illustrating a second protecting layer under a scanning electron microscope provided in an embodiment of the present disclosure.
Figure 5:
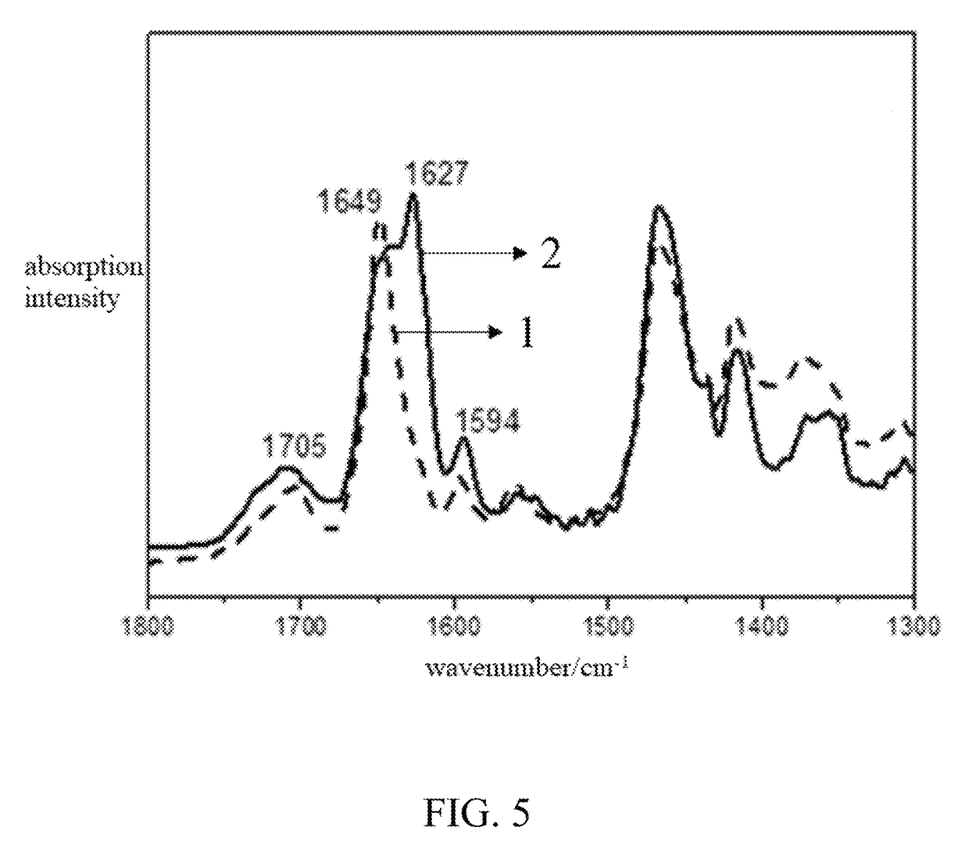
FIG. 5 is a characterization diagram illustrating an infrared spectrum of a second protecting layer provided in an embodiment of the present disclosure.
Figure 6:
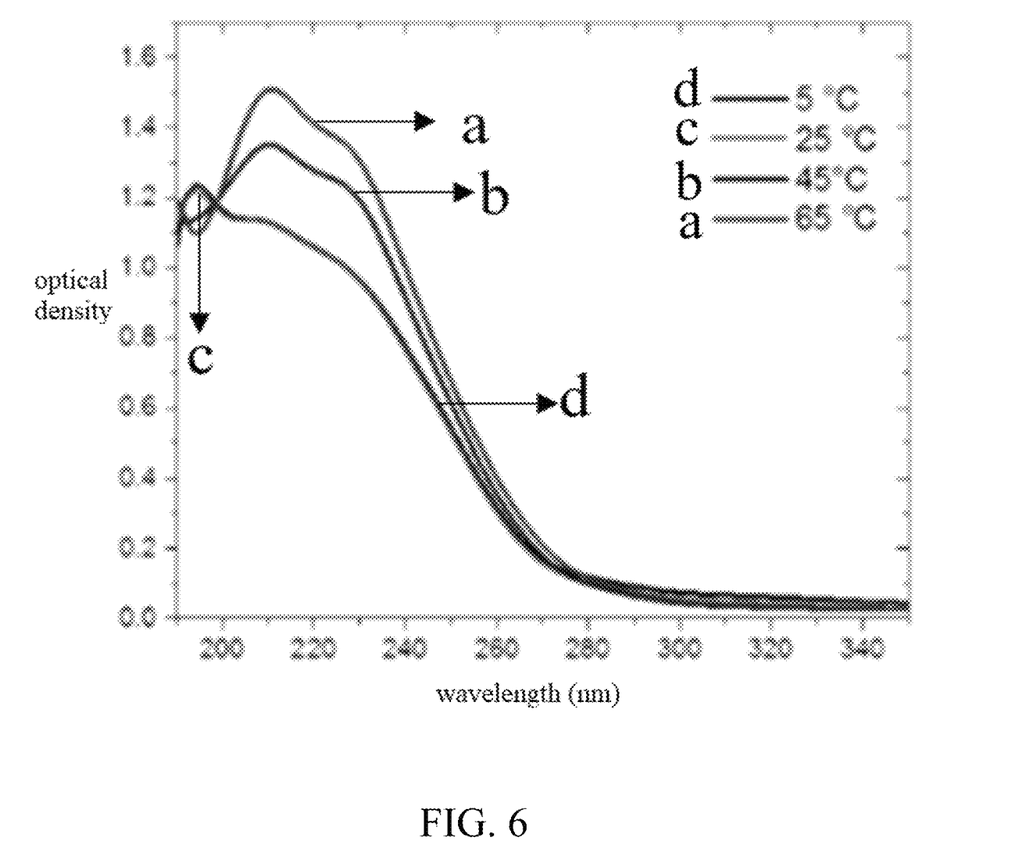
FIG. 6 is a characterization diagram illustrating an ultraviolet spectrum of a second protecting layer provided in an embodiment of the present disclosure.

The formula 1 is:

Furthermore, the embodiment of the present disclosure characterizes the second protecting layer 203 using a scanning electron microscope and technologies of Fourier infrared spectrum and ultraviolet spectrum.

Please refer to FIG. 4, which is a diagram under a scanning electron microscope illustrating the second protecting layer 203 formed by self-assembly of compound 1. As shown in the figure, the second protecting layer 203 formed by self-assembly of compound 1 is a highly cross-linking three-dimensional network film, and the network film is fibrous. Due to randomness of its growth, the second protecting layer 203 obtained has good hydrophobicity. During an assembly process of supermolecules by compound 1 through self-assembly, because of the supramolecular assembly structure with a self-healing capability, it has good resistance to mechanical damage. Furthermore, because the second protecting layer has a polymer-like structure, it has high mechanical strength and good heat resistance.

Further, please refer to FIG. 5, which is an infrared spectrum diagram illustrating the second protecting layer 203 formed by self-assembly of compound 1, wherein a curve 1 is an infrared spectrum curve of compound 1, and a curve 2 is an infrared spectrum curve of the second protecting layer 203 formed by self-assembly of compound 1. As can be seen from FIG. 5, a peak with wavenumber 1649 cm$^{-1}$ is blue shifted to that of 1627 cm$^{-1}$, indicating formation of a hydrogen bond in the self-assembly process.

Please refer to FIG. 6, which is an ultraviolet spectrum diagram illustrating the second protecting layer 203 formed by self-assembly of compound 1. Curves a, b, c, and d represent ultraviolet spectrum of compound 1 at 65, 45, 25, and 5 degrees Celsius respectively. As can be seen from the figure, during the self-assembly process of compound 1, with a decrease in temperature (from 65 degrees Celsius to 5 degrees Celsius), compound 1 is slowly assembled and blued shifted, and a peak of the second protecting layer 203 becomes wider, indicating that compound 1 is self-assembled and forms a highly cross-linking three-dimensional network structure. It can be seen that the second protecting layer 203 has a strong absorption peak in an ultraviolet band from 190 nanometers to 280 nanometers. In other words, the second protecting layer 203 can further reduce absorption of ultraviolet light by the light-emitting element, thus improving stability of the display panel.

The embodiments of the present disclosure provide a display panel and a manufacturing method thereof. In the manufacturing method of the display panel provided in the embodiments of the present disclosure, the first protecting layer and the second protecting layer are formed on the light-emitting element in sequence. As the second protecting layer is formed by an organic compound with small molecules through self-assembly and randomness of the small molecules during a growth process, the second layer has good hydrophobicity. Furthermore, as a self-assembly process of the organic compound is a supramolecular assembly process, the second layer is resistant to mechanical damage due to self-healing capabilities of supramolecular assemblies. Furthermore, because the second protecting layer has a polymer-like structure, it has high mechanical strength and good heat resistance. The first protecting layer has good light transmittance, and if the light-emitting element is physically damaged, damage of moisture to the light-emitting device can be reduced by consuming a side base of the first protecting layer. Therefore, the display panel and the manufacturing method thereof provided in the embodiments of the present disclosure are used to improve poor reliability of the display panel due to moisture entering the display panel.

In addition, an encapsulation layer is disposed on the second protecting layer in an embodiment of the present disclosure to further prevent moisture from eroding the light-emitting element.

Although the present disclosure has been disclosed in the above preferred embodiments, the above preferred embodiments do not intend to limit the present disclosure. Various modifications and changes may be made by ordinary person skilled in the art without departing from the spirit and scope of this disclosure. Therefore, the scope of protection of this disclosure is subject to the scope defined by the claims.

What is claimed is:

1. A manufacturing method of a display panel, comprising the following steps:
   providing a light-emitting element;
   coating a polymer solution on the light-emitting element followed by subjecting the light-emitting element to a first annealing process to form a first protecting layer; and
   coating an organic compound solution on the first protecting layer and making the organic compound self-assemble on the first protecting layer to form a second protecting layer, wherein the second protecting layer is a crosslinking three-dimensional network structure formed through self-assembly by the organic compound which is an aromatic hydrocarbon derivative having one or more carboxylic acid amide groups, and each of the one or more carboxylic acid amide groups is represented by a chemical structural formula as set forth below:

wherein ✱ represents the attachment point of the carboxylic acid amide group to the aromatic hydrocarbon derivative, and R represents an alkane group with a carbon number of 1 to 8, and wherein the crosslinking three-dimensional network structure and the polymer are different materials.

2. The manufacturing method of the display panel as claimed in claim 1, wherein the step of coating the organic compound solution on the first protecting layer and making the organic compound self-assemble on the first protecting layer to form the second protecting layer comprises:
   dispersing the organic compound in a solvent and adjusting hydrogen ion concentration (pH) of the solvent to acidity to form the organic compound solution;
   coating the organic compound solution on the first protecting layer and making the organic compound self-assemble on a surface of the first protecting layer to form a one-dimensional structure; and
   subjecting the one-dimensional structure to a second annealing process at an annealing temperature ranging from 25 degrees Celsius to 70 degrees Celsius to form the second protecting layer.

3. The manufacturing method of the display panel as claimed in claim 2, wherein the pH of the organic compound solution ranges from 3 to 7.

4. The manufacturing method of the display panel as claimed in claim 1, wherein the organic compound comprises at least one of compounds represented by following chemical structural formulas:

(1)

(2)

and (3)

wherein R represents an alkane group with a carbon number of 1 to 8, x represents a number of the carboxylic acid amide group, and y represents a number of the carboxylic acid amide group, wherein $1 \leq x \leq 3$, $1 \leq y \leq 2$, and $1 \leq z \leq 2$.

5. The manufacturing method of the display panel as claimed in claim 4, wherein when x=2, the two carboxylic acid amide groups in formula (1) are meta-substituted or para-substituted; when y=2, the two carboxylic acid amide groups in formula (2) are meta-substituted or para-substituted; and when z=2, the two carboxylic acid amide groups in formula (3) are meta-substituted.

6. The manufacturing method of the display panel as claimed in claim 4, wherein the organic compound comprises:

7. The manufacturing method of the display panel as claimed in claim 1, wherein after the step of coating the organic compound solution on the first protecting layer and making the organic compound self-assemble on the first protecting layer to form the second protecting layer, the method further comprises:
   forming an encapsulation layer on the second protecting layer, wherein the encapsulation layer comprises at least one inorganic layer and at least one organic layer which are alternatively stacked.

8. The manufacturing method of the display panel as claimed in claim 1, wherein the first protecting layer is formed through anionic polymerization.

9. A display panel, comprising:
   a light-emitting element;
   a first protecting layer covering at least part of the light-emitting element, wherein the first protecting layer comprises a polymer material; and
   a second protecting layer covering the first protecting layer, wherein the second protecting layer is a cross-linking three-dimensional network structure formed through self-assembly by an aromatic hydrocarbon derivative having one or more carboxylic acid amide groups, and each of the one or more carboxylic acid amide groups is represented by a chemical structural formula as shown below:

wherein * represents the attachment point of the carboxylic acid amide group to the aromatic hydrocarbon derivative, and R represents an alkane group with a carbon number of 1 to 8, and wherein the crosslinking three-dimensional network structure and the polymer material are different materials.

10. The display panel as claimed in claim 9, wherein the aromatic hydrocarbon derivative having the carboxylic acid amide groups comprises at least one of compounds in following chemical structural formulas:

(1)

(2)

or (3)

wherein x represents a number of the carboxylic acid amide groups in formula (1), y represents a number of the carboxylic acid amide groups in formula (2), and z represents a number of the carboxylic acid amide groups in formula (3), wherein $1 \leq x \leq 3$, $1 \leq y \leq 2$, and $1 \leq z \leq 2$.

11. The display panel as claimed in claim 10, wherein when x=2, the two carboxylic acid amide groups in the formula (1) are meta-substituted or para-substituted.

12. The display panel as claimed in claim 10, wherein when y=2, the two carboxylic acid amide groups in the formula (2) are meta-substituted or para-substituted.

13. The display panel as claimed in claim 10, wherein when z=2, the two carboxylic acid amide groups in the formula (3) are meta-substituted.

14. The display panel as claimed in claim 10, wherein the aromatic hydrocarbon derivative having the carboxylic acid amide groups comprises:

15. The display panel as claimed in claim 9, further comprising:

an encapsulation layer covering the second protecting layer, wherein the encapsulation layer comprises at least one inorganic layer and at least one organic layer which are alternatively stacked.

16. The display panel as claimed in claim 9, wherein materials of the first protecting layer comprise at least one of polyvinylidene fluoride, polyphenylene sulfide, ethylene vinyl alcohol copolymer, polyphthalamide, polyamide-imide, polyamide, polyetherimide, polymethyl methacrylate, or polyethylene terephthalate.

17. A display panel, comprising:

a light-emitting element;

a first protecting layer covering at least a part of the light-emitting element, wherein the first protecting layer comprises a polymer material, and the polymer material comprises at least one of polyvinylidene fluoride, polyphenylene sulfide, ethylene vinyl alcohol copolymer, polyphthalamide, polyamide-imide, polyamide, polyetherimide, polymethyl methacrylate, or polyethylene terephthalate; and a second protecting layer covering the first protecting layer, wherein the second protecting layer is a crosslinking three-dimensional network structure formed through self-assembly by an aromatic hydrocarbon derivative having one or more carboxylic acid amide groups, wherein each of the one or more carboxylic acid amide groups is represented by a chemical structural formula as shown below:

wherein * represents the attachment point of the carboxylic acid amide group to the aromatic hydrocarbon derivative, and R represents an alkane group with a carbon number of 1 to 8, and the aromatic hydrocarbon derivative having the carboxylic acid amide groups comprises at least one of compounds represented by following chemical structural formulas:

(1)

(2)

(3)

wherein x represents a number of the carboxylic acid amide groups in formula (1), y represents a number of the carboxylic acid amide groups in formula (2), and z represents a number of the carboxylic acid amide groups in formula (3), wherein $1 \leq x \leq 3$, $1 \leq y \leq 2$, and $1 \leq z \leq 2$.

* * * * *